(12) United States Patent
Gani

(10) Patent No.: US 11,581,280 B2
(45) Date of Patent: Feb. 14, 2023

(54) WLCSP PACKAGE WITH DIFFERENT SOLDER VOLUMES

(71) Applicant: STMICROELECTRONICS PTE LTD, Singapore (SG)

(72) Inventor: David Gani, Choa Chu Kang (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 0 days.

(21) Appl. No.: 17/104,968

(22) Filed: Nov. 25, 2020

(65) Prior Publication Data
US 2021/0202419 A1 Jul. 1, 2021

Related U.S. Application Data

(60) Provisional application No. 62/954,305, filed on Dec. 27, 2019.

(51) Int. Cl.
*H01L 23/00* (2006.01)
*H01L 23/498* (2006.01)

(52) U.S. Cl.
CPC ........ *H01L 24/06* (2013.01); *H01L 23/49816* (2013.01); *H01L 2224/0401* (2013.01); *H01L 2224/13028* (2013.01)

(58) Field of Classification Search
CPC ............... H01L 24/06; H01L 23/49816; H01L 2224/0401; H01L 2224/13028; H01L 24/16; H01L 24/03; H01L 24/05; H01L 2224/0231; H01L 2224/0347; H01L 2224/0348; H01L 2224/05008; H01L 2224/05017; H01L 2224/05019; H01L 2224/05073; H01L 2224/05147; H01L 2224/05564; H01L 2224/05639; H01L 2224/05644; H01L 2224/05647; H01L 2224/06051; H01L 2224/06102;
(Continued)

(56) References Cited

U.S. PATENT DOCUMENTS 5,587,342 A 12/1996 Lin et al.
6,451,127 B1 9/2002 Li et al.
(Continued)

FOREIGN PATENT DOCUMENTS

EP 1035583 A2 9/2000
EP 2099065 A1 9/2009
(Continued)

*Primary Examiner* — Douglas W Owens
(74) *Attorney, Agent, or Firm* — Seed IP Law Group LLP

(57) ABSTRACT

The present disclosure is directed to a wafer level chip scale package (WLCSP) with various combinations of contacts and Under Bump Metallizations (UBMs) having different structures and different amounts solder coupled to the contacts and UBMs. Although the contacts have different structures and the volume of solder differs, the total standoff height along the WLCSP remains substantially the same. Each portion of solder coupled to each respective contact and UBM includes a point furthest away from an active surface of a die of the WLCSP. Each point of each respective portion of solder is co-planar with each other respective point of the other respective portions of solder. Additionally, the contacts with various and different structures are positioned accordingly on the active surface of the die of the WLCSP.

20 Claims, 7 Drawing Sheets

(58) Field of Classification Search
CPC . H01L 2224/06179; H01L 2224/11849; H01L 2224/119; H01L 2224/13006; H01L 2224/13007; H01L 2224/13022; H01L 2224/13026; H01L 2224/13076; H01L 2224/13139; H01L 2224/13144; H01L 2224/13147; H01L 2224/13562; H01L 2224/136; H01L 2224/13794; H01L 2224/138; H01L 2224/14179; H01L 2224/16227; H01L 24/11; H01L 2224/0236; H01L 2224/02377; H01L 2224/0239; H01L 2224/0345; H01L 2224/03452; H01L 2224/0346; H01L 2224/05018; H01L 2224/05024; H01L 24/02; H01L 2224/05557; H01L 2224/05558; H01L 2224/05559; H01L 2224/05569; H01L 2224/0601; H01L 2224/0603; H01L 2224/1132; H01L 2224/1147; H01L 2224/13294; H01L 2224/133; H01L 2224/1401; H01L 2224/14051; H01L 2224/14505; H01L 24/13; H01L 24/14; H01L 2224/131; H01L 2224/1403; H01L 2924/3512; H01L 2924/35121

See application file for complete search history.

(56) References Cited

U.S. PATENT DOCUMENTS

| | | |
|---|---|---|
| 8,581,418 B2 | 11/2013 | Wu et al. |
| 8,643,150 B1 | 2/2014 | Xu et al. |
| 9,553,065 B2 | 1/2017 | Lin et al. |
| 9,799,618 B1 | 10/2017 | Arvin et al. |
| 10,163,844 B2 | 12/2018 | Lin et al. |
| 10,163,866 B2 | 12/2018 | Chen et al. |
| 10,312,208 B2 * | 6/2019 | Xue ................... H01L 24/05 |
| 2005/0017355 A1* | 1/2005 | Chou ................... H01L 24/13 |
| | | 257/E23.021 |
| 2005/0110161 A1* | 5/2005 | Naito ................... H01L 24/14 |
| | | 257/E23.068 |
| 2006/0292711 A1 | 12/2006 | Su et al. |
| 2007/0007665 A1* | 1/2007 | Clevenger ............ H01L 23/13 |
| | | 257/E21.511 |
| 2007/0290345 A1* | 12/2007 | Clevenger ......... H01L 23/49838 |
| | | 257/E21.511 |
| 2011/0221058 A1* | 9/2011 | Pagaila ................ H01L 24/05 |
| | | 257/737 |
| 2013/0134581 A1 | 5/2013 | Lin et al. |
| 2014/0147973 A1* | 5/2014 | Choi ................... H01L 24/73 |
| | | 438/124 |
| 2017/0250153 A1 | 8/2017 | Kikuchi et al. |
| 2019/0305202 A1* | 10/2019 | Sakong ................ H01L 24/13 |
| 2022/0122941 A1* | 4/2022 | Teng ................... H01L 21/78 |

FOREIGN PATENT DOCUMENTS

| | | |
|---|---|---|
| JP | 2001085558 A | 3/2001 |
| WO | WO 03026833 A1 | 4/2003 |

* cited by examiner

WLCSP PACKAGE WITH DIFFERENT SOLDER VOLUMES

BACKGROUND

Technical Field

The present disclosure is directed to a wafer level chip scale package (WLCSP) that includes contacts and solder bumps.

Description of the Related Art

Generally, semiconductor device packages, such as chip scale packages or wafer level chip scale packages (WLCSPs), are electrically coupled to a printed circuit board (PCB) by means of solder bumps or conductive adhesive material that have the same shape, height, and volume.

As demand increases to provide a greater number of WLCSPs in electronic devices to perform ever increasing complex functions while at the same time reducing the cost of manufacturing, increasing the resistance to external stresses to reduce the likelihood of failure, and increasing the board level reliability of the WLCSPs, there are significant challenges to balance all of the above preferences. Examples of electronic devices include laptops, displays, televisions, smart phones, tablets, or any other electronic device.

BRIEF SUMMARY

Embodiments of the present disclosure overcome various significant challenges associated with wafer level chip scale packages (WLCSPs), such as increasing the resistance to external stresses to reduce the likelihood of failure and increasing the board level reliability of the WLCSPs.

One significant challenge is increasing the strength of electrical connections between a WLCSP and a PCB to reduce failure while maintaining strong electromigration performance. For example, failures that may occur due to external stresses and forces may include cracking, delamination, melting, or any other type of failure that may occur in a WLCSP when in use. It is desired to have the WLCSP and the PCB have a strong physical connection and strong electrical communication between each other. However, specific electrical connections in specific positions between the WLCSP and the PCB are more susceptible to failure due to external stresses and forces than other electrical connections at other positions. Accordingly, it is desired to provide different types of electrical connections at different positions between the WLCSP and the PCB to maintain good electrical communication while reducing the likelihood of failure in the most susceptible of electrical connections.

Another significant challenge is providing WLCSPs with electrical connections that all have the same height but are made of different amounts of conductive material to increase board level reliability of the WLCSPs and increase resistance of the WLCSPs against external forces and stresses. These external forces or stresses may be caused by being dropped, being exposed to thermal cycling, or other external forces and stresses a WLCSP may be exposed during use.

Yet another significant challenge is providing semiconductor die or WLCSPs with different types of electrical connections. For example, the different types of electrical connections are capable of carrying different amounts of current to improve the energy efficiency of the electronic device and increase the useful life span of the semiconductor die, the WLCSPs, and the electronic device as a whole.

In view of these significant challenges above, which is not a complete list, it is desirable to provide WLCSPs that can perform more complex functions while improving resistance against failure such as cracking or delamination in electrical connections between a WLCSP and a PCB, increasing the strength of electromigration at specific contacts to improve electrical communication between the WLCSP and various electrical components within an electronic device, and providing electrical connections that have the same standoff height so the WLCSP can be coupled to other electrical components without any further processing or addition of more solder or conductive material.

The present disclosure is directed to various embodiments of a WLCSP with electrical connections made of different amounts of solder material and differently shaped Under Bump Metallizations (UBMs) to increase the electromigration at specific electrical connections, increase the resistance to cracking or delamination due to external stresses at specific electrical connections, and reduce the cost of manufacturing a WLCSP with electrical connections made of different amounts of solder material and differently shaped UBMs.

According to one or more embodiments, a WLCSP includes a die having active components, an active surface, and a passive surface. The passive surface faces away from the active surface. Electrical contacts are on the active surface and are coupled to the active components in the die. Multiple layers of repassivation materials are on the active surface of the substrate and are utilized to form the redistribution layer (RDL) on the electrical contacts of the die, and to form a plurality of UBMs with different heights on the RDL. Each UBM of the plurality of UBMs and the RDL electrically communicate with the active and passive components in the die. For example, the active and passive components receive an electrical current that passes through the UBMs and the RDL, and the active and passive components communicate electrical signals to external electrical components through the RDL and the plurality of UBMs.

In some embodiments, a first UBM has a first height and a second UBM has a second height that is less than the first height. The second UBM includes a recess to receive a solder or conductive material whereas the first UBM includes a protruding portion that the solder or conductive material is placed on. A first standoff height of the solder or conductive material and the first UBM is substantially the same as a second standoff height of the solder or conductive material and the second UBM.

In some embodiments, a first UBM with a first height is coupled to the RDL and a recess or opening is aligned with the RDL. The recess or opening is configured to receive a solder or conductive material that is placed directly on the RDL. In this alternative embodiment, the solder or conductive material and the first UBM have a first standoff height that is substantially the same as a second standoff height of the solder or conductive material on the RDL and in the recess or opening.

In some embodiments, a first UBM is directly coupled to a first contact of the die and a second UBM is directly coupled to a second contact of the die. In other words, no RDL is present in this alternative embodiment. The first UBM has a first height and the second UBM has a second height that is less than the first height. The second UBM may have a recess or opening that receives the solder or conductive material. A solder or conductive material is placed on the first UBM and the second UBM. A first standoff height of the solder or conductive material and the first UBM is substantially the same as a second standoff height of the solder or conductive material and the second UBM.

BRIEF DESCRIPTION OF THE SEVERAL VIEWS OF THE DRAWINGS

In the drawings, identical reference numbers identify similar elements or acts unless the context indicates otherwise. The sizes and relative portions of the elements in the drawings are not necessarily drawn to scale.

DETAILED DESCRIPTION

Figure 1:
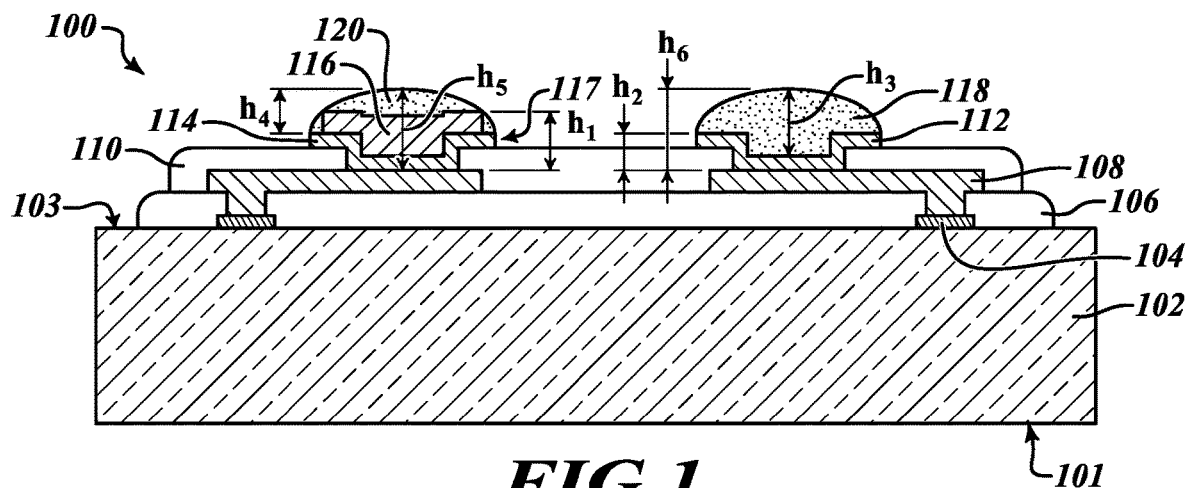
FIG. 1 is a cross-sectional view of a wafer level chip scale package (WLCSP) having a first under bump metallization (UBM) with a protruding portion and a second UBM with a recess, in accordance with one or more embodiments.

In the following description, certain specific details are set forth in order to provide a thorough understanding of various embodiments of the disclosure. However, one skilled in the art will understand that the disclosure may be practiced without these specific details. In other instances, well-known structures associated with electronic components and semiconductor fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The term "left" and "right" are used for only discussion purposes based on the orientation of the components in the discussion of the Figures in the present disclosure as follows. These terms are not limiting as the possible positions explicitly disclosed, implicitly disclosed, or inherently disclosed in the present disclosure.

The term "substantially" is used to clarify that there may be slight differences when a WLCSP is manufactured in the real world, as nothing can be made perfectly equal or perfectly the same. This term is not limiting as this term is only to clarify real world manufacturing of a WLCSP. In other words, substantially means that there may be some slight variation in actual practice as nothing can be made perfect, but instead is made within accepted tolerances.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The present disclosure is directed to various embodiments of semiconductor device packages, such as wafer level chip scale packages (WLCSPs), that include a die and first portions and second portions of conductive material on an active surface of the die that have different heights. The first portions have a first height and the second portions have a second height that is greater than the first height. Even though the first portions and the second portions have different heights, the first portions and the second portions each have a point that is furthest away from the active surface of the WLCSP that are substantially coplanar in a plane that is substantially parallel to the active surface of the WLCSP. The term "substantially," means while in the preferred embodiment the points may be aligned perfectly, in practice, there may be some variation in how the points are aligned when the WLCSP is manufactured in real world practice. In other words, substantially means that there may be some slight variation in actual practice as nothing can be made perfect, but instead is made within accepted tolerances.

While various embodiments are shown and described with respect to wafer level chip scale packages (WLCSPs), it will be readily appreciated that embodiments of the present disclosure are not limited thereto. In various embodiments, the structures, devices, methods and the like described herein may be embodied in or otherwise utilized in any suitable type or form of semiconductor packages, and may be manufacturing utilizing any suitable semiconductor packaging technologies.

FIG. 1 is a cross-sectional side view of a WLCSP 100, in accordance with one or more embodiments. The WLCSP includes a die 102, which may be a semiconductor die made from a semiconductor material such as silicon, germanium, gallium arsenide, silicon carbide, or the like. The die 102 has a passive surface 101 and an active surface 103, and various active components, such as electrical components of one or more integrated circuits or the like, may be formed in the die 102 and may be located at or near the active surface 103. A plurality of contact pads 104 is on the active surface 103 of the die 102. Each respective contact pad of the plurality of contact pads 104 is coupled to a respective active or passive component within the die 102. The contact pads 104 are electrically coupled to the die 102, and may communicate various signals such as power, command, and instruction signals to and from the active components in the die 102. The passive surface 101 of the die 102 faces away from the active surface 103 of the die 102.

A first repassivation layer 106 is on the active surface 103 of the die 102 and the first repassivation layer 106 has openings that are aligned with the contact pads 104. In various embodiments, the first repassivation layer 106 may be formed of any dielectric or insulating material. These openings allow the contact pads 104 to be coupled to a redistribution layer (RDL) 108 made of a conductive material. The conductive material may be a copper material, a silver material, a gold material, an alloy material, or any other conductive material or combination of conductive materials as desired. The RDL 108 is on the first repassivation layer 106 and extends into the first repassivation layer 106 towards the die 102. The RDL 108 extends into the first repassivation layer 106 through the openings of the first repassivation layer 106 to electrically and mechanically couple the RDL 108 to the contact pads 104.

Each of the contact pads 104 is coupled to a respective portion (e.g., a conductive trace or segment) of the RDL 108. The portions of the RDL 108 are laterally separated from each other, and in some embodiments, the portions of the RDL 108 may be electrically isolated from one another so that each portion may carry separate signals to and from the electrical components of the die 102. Some of the portions of the RDL 108 may be coupled to multiple contact pads of the plurality of contact pads 104 and some of the portions of the RDL 108 may be coupled to only one contact pad of the plurality of contact pads 104. The portions of the RDL 108 respectively fill the openings in the first repassivation layer 106, are coupled to the plurality of contact pads 104, and are on the first repassivation layer 106.

A second repassivation layer 110 is on the first repassivation layer 106 and the RDL 108. The second repassivation layer 110 includes a plurality of openings that are each aligned with and at least partially expose a respective portion of the RDL 108. In various embodiments, the second repassivation layer 110 may be formed of any dielectric or insulating material, and in some embodiments, the second repassivation layer 110 may be formed of a same material as the first repassivation layer 106.

A first contact 112 is formed in a first opening of the plurality of openings of the second repassivation layer 110 and a second contact 117 is formed in a second opening of the plurality of openings of the second repassivation layer 110. The first contact 112 includes a recessed portion that extends towards the active surface 103 of the die 102 (e.g., the recessed portion of the first contact 112 may extend at least partially into the second opening of the second repassivation layer 110). The second contact 117 includes a first portion 114 and a second portion 116 that is on the first portion 114. The first contact 112 and the second contact 117 may be referred as and are Under Bump Metallizations (UBMs). The second contact 117 is positioned closer to the left hand side of the die 102 and the first contact 112 is positioned closer to the right hand side of the die 102. Even though only two contacts are shown in FIG. 1, there may be several contacts with the structure of the first contact 112, several contacts with the structure of the second contact 117, or several contacts with different structures altogether that are on the active surface 103 of the die 102. For example, if the WLCSP 100 has a ball grid array (BGA) solder ball configuration, various contacts of the WLCSP 100 in different positions may have different structures such as those of the first contact 112 and second contact 117, or some other contact structure altogether. It may be desirable to have different contacts with different structures in different positions, which will be discussed in greater detail below with respect to FIG. 5.

The second contact 117 has a height $h_1$ that extends from a surface of the RDL 108 that the second contact 117 is on to a surface of the second contact 117 that faces away from the surface of the RDL 108. The first contact 112 has a height $h_2$ that extends from a surface of the RDL 108 that the first contact 112 is on to a point of the first contact 112 that is furthest away from the surface of the RDL 108. The height $h_2$ of the first contact 112 is less than the height $h_1$ of the second contact 117.

A first conductive structure 118 is on the first contact 112 and a second conductive structure 120 is on the second contact 117. The first conductive structure 118 may be referred to as a first solder structure, a first portion of a conductive material, or a first portion of a solder material. The second conductive structure 120 may be referred to as a second solder structure, a second portion of a conductive material, or a second portion of a solder material. The first conductive structure 118 and the second conductive structure 120 may be a solder material, a solder paste material, or some other conductive material configured to couple one electronic component to another electronic component. The second conductive structure 120 has a height $h_4$ that extends from a surface of the first portion 114 of the second contact 117 that faces away from the active surface 103 of the die 102 to a point of the second conductive structure 120 that is furthest away from the active surface 103 of the die 102. The first conductive structure 118 has a height $h_3$ that extends from a surface within the recess of the first contact 112 that faces away from the active surface 103 of the die 102 to a point of the first conductive structure 118 furthest away from the active surface 103 of the die 102. The height $h_4$ of the second conductive structure 120 is less than the height $h_3$ of the first conductive structure 118.

While the heights $h_3$, $h_4$ of the first conductive structure 118 and second conductive structure 120 of conductive material are not equal, points of the first conductive structure 118 and the second conductive structure 120 furthest away from the active surface 103 of the die 102 are coplanar or substantially in a plane that is substantially parallel to the active surface 103 and the passive surface 101 of the die 102. The reason these points are coplanar is because a first total height $h_5$ of the second conductive structure 120 and the second contact 117 (e.g., a height between the highest point of the second conductive structure 120 and the RDL 108) is equal a second total height $h_6$ of the first conductive structure 118 and the first contact 112. That is, a distance between the RDL 108 and the highest point or apex of each of the first and second conductive structures 118, 120 is substantially equal. It is desirable that the first total height $h_5$ is substantially equal to the second total height $h_6$, however, for brevity and simplicity sake, the desirability of these substantially equal heights will be discussed later in detail after the embodiments in FIGS. 1-3 have been discussed.

Figure 2:
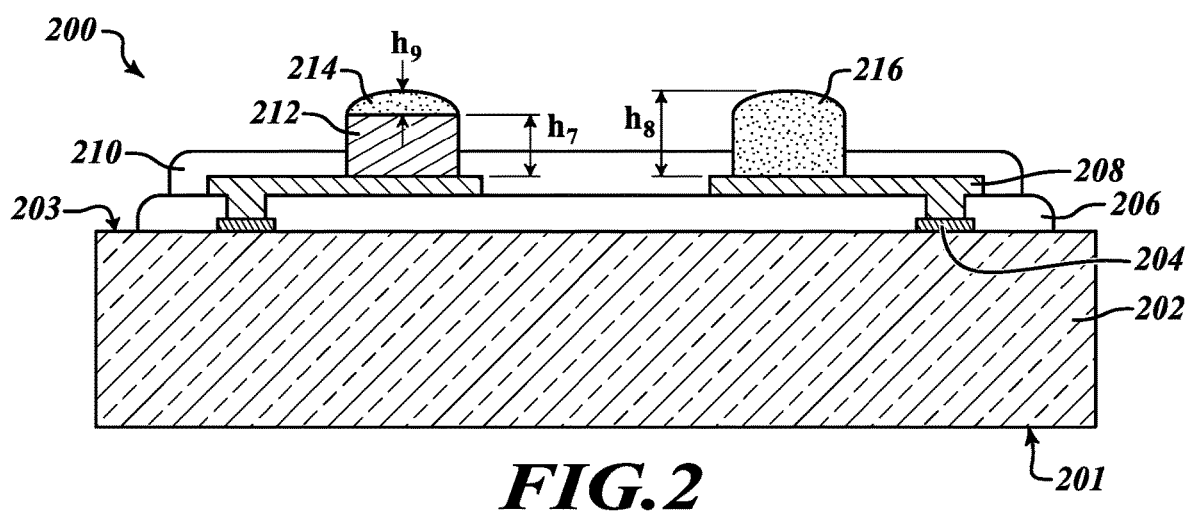
FIG. 2 is a cross-sectional view of a WLCSP having a first UBM and an opening, in accordance with one or more embodiments.

FIG. 2 illustrates a WLCSP 200, in accordance with one or more embodiments. The WLCSP 200 includes a die 202 with a passive surface 201 and an active surface 203 with a plurality of contact pads 204. The plurality of contact pads 204 are coupled to active components within the die 202 and provide power, command, and instruction signals to the active components of the die 202.

A first repassivation layer 206 is on the active surface of the die 202 and the first repassivation layer 206 has openings that are aligned with the contact pads 204. These openings allow the contact pads 204 to be coupled to a redistribution layer (RDL) 208 made of a conductive material. The conductive material may be a copper material, a silver material, a gold material, an alloy material, or any other conductive material as desired. The RDL 208 is on the repassivation layer 206 and extends into the repassivation layer 206 towards the die 202. The RDL 208 extends into the repassivation layer 206 through the openings of the repassivation layer 206 to couple the RDL 208 to the contact pads 204.

Each respective contact pad 204 of the plurality of contact pads 204 are coupled to a respective portion of the RDL 208. Each respective portion of the RDL 208 is laterally separated from each other. Some of the respective portions of the RDL 208 may be coupled to multiple respective contact pads of the plurality of contact pads 204 and some of the respective portions of the RDL 208 may be coupled to only one of respective contact pads of the plurality of contact pads 204. The portions of the RDL 208 fill the openings in the first repassivation layer 206, are coupled to the plurality of contact pads 204, and are on the first repassivation layer 206.

A second repassivation layer 210 is on the first repassivation layer 206 and the RDL 208. The second repassivation layer 210 includes a plurality of openings that are each aligned with and expose a portion of each respective portion of the RDL 208.

A contact 212, which may be referred to as and is a UBM 212, is formed in a first opening of the plurality of openings of the second repassivation layer 210. The contact 212 has a height $h_7$ that extends from a surface of a respective portion of the RDL 208 on which the contact 212 is mechanically and electrically coupled. The contact 212 extends away from the active surface 203 of the die 202. A first conductive structure 214 is coupled to a surface of the contact 212 that faces away from the active surface 203 of the die 202. The first conductive structure 214 may be referred to as a first solder structure, a first portion of a conductive material, or a first portion of a solder material. The first conductive structure 214 has a height $h_9$.

A second conductive structure 216 is coupled to a surface of a respective portion of the RDL 208 that faces away from the active surface 203 of the die. The second conductive structure 216 may be referred to as a second solder structure, a second portion of a conductive material, or a second portion of a solder material. The second conductive structure 216 has a height $h_8$ that is greater than the height $h_7$ of the contact 212 and is greater than the height $h_9$ of the first conductive structure 214. The summation of the height $h_7$ of the contact 212 and the height $h_9$ of the first conductive structure 214 is substantially equal to the height $h_8$ of the second conductive structure 216. It is desirable that the heights $h_7$, $h_9$ of the contact 212 and the first conductive structure 214 add up to be substantially equal to the height $h_8$ of the second conductive structure 216, however, for brevity and simplicity sake, the desirability of these equal heights will be discussed in detail after the embodiments in FIGS. 1-3 have been discussed. It is also desirable to have a contact with the height $h_7$ and no contact present where the second conductive structure 216 is coupled to the respective portion of the RDL 208, which will be discussed in greater detail with respect to FIG. 5.

Figure 3:
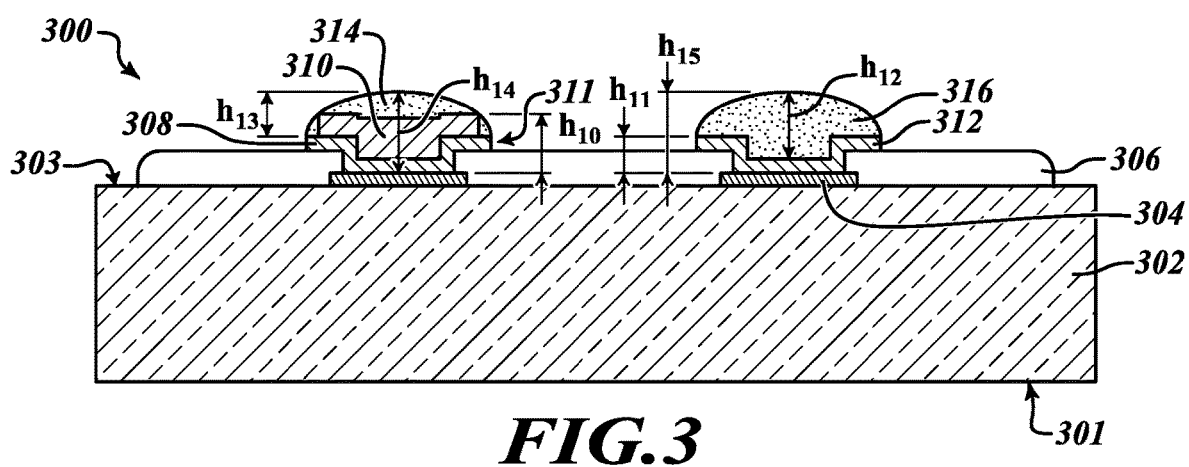
FIG. 3 is a cross-sectional view of a WLCSP having a first UBM with a protruding portion and a second UBM with a recess coupled directly to contacts of a die, in accordance with one or more embodiments.

FIG. 3 illustrates a WLCSP 300, in accordance with one or more embodiments. The WLCSP 300 includes a die 302 with a passive surface 301 and an active surface 303 with a plurality of contact pads 304. The plurality of contact pads 304 are coupled to active components within the die 302 and provide power, command, and instruction signals to the active components of the die 302.

A first repassivation layer 306 is on the active surface 303 of the die 302 and the first repassivation layer 306 has openings that are aligned with the contact pads 304. These openings allow the contact pads 304 to be coupled to a plurality of contacts 311, 312.

A first portion 308 of a first contact 311 is coupled to a respective contact pad 304 of the plurality of contact pads 304 and a second portion 310 of the first contact 311 is coupled to the first portion 308 of the first contact 311. The first contact 311 may be referred to as and is a first UBM 311. The first contact 311 has a height $h_{10}$ that extends from a surface of the respective contact pad 304 that the first contact 311 is coupled to a surface of the second portion 310 of the first contact 311 that faces away from the active surface 303 of the die 302.

A second contact 312 is coupled to a respective contact pad 304 of the plurality of contact pads 304. The second contact 312 includes a recess that extends towards the active surface 303 of the die 302. The second contact 312 has a height $h_{11}$ that extends from a surface of the respective contact pad 304 that the second contact 312 is coupled to a surface of the second contact 312 that faces away from the active surface 303 of the die 302. The height $h_{11}$ of the second contact 312 is less than the height $h_{10}$ of the first contact 311. The second contact may be referred to as and is a second UBM 312.

Even though only two contacts are shown in FIG. 3, there may be several contacts with the structure of the first contact 311, several contacts with the structure of the second contact 312, or several contacts that have different structures than the two disclosed in FIG. 3 that are on the active surface 303 of the die 302. For example, if the WLCSP 300 has a ball grid array (BGA) solder ball configuration, various contacts of the WLCSP 300 in different positions may have different structures than the first contact 311 and the second contact 312. It is desirable to have different contacts with different structures and heights in different positions, which will be discussed in greater detail below with respect to FIG. 5.

A first conductive structure 314 is on the first contact 311. The first conductive structure 314 may be referred to as a first solder structure, a first portion of a conductive material, or a first portion of a solder material. The first conductive structure 314 has a height $h_{13}$ that extends from a surface of the first portion 308 of the first contact 311 that faces away from the active surface 303 of the die 302 to a point of the first conductive structure 314 that is furthest away from the active surface 303 of the die 302 with respect to the first conductive structure 314.

A second conductive structure 316 is on the second contact 312. The second conductive structure 316 may be referred to as a second solder structure, a second portion of a conductive material, or a second portion of a solder material. The second conductive structure 316 has a height $h_{12}$ that extends from a surface within the recess of the second contact 312 that faces away from the active surface 303 of the die 302 to a point furthest away from the active surface 303 of the die 302 with respect to the second conductive structure 316.

While the heights $h_{13}$, $h_{12}$ of the first conductive structure 314 and second conductive structure 316 of conductive material are not equal, points of the first conductive structure 314 and the second conductive structure 316 of the conductive material furthest away from the active surface 303 of the die 302 are coplanar in a plane that is substantially parallel to the active surface 303 and the passive surface 301 of the die 302. The reason these points are coplanar as described directly above is because a first total height $h_{14}$ of the first conductive structure 314 and the first contact 311 (e.g., a height between the highest point of the first conductive structure 314 and the respective contact pad 304 the first contact 311 is coupled to) is equal a second total height $h_{15}$ of the second conductive structure 316 and the second contact 312. That is, a distance between each respective contact pad 304 and the highest point or apexes of the first and second conductive structures 314, 316 is substantially equal. It is desirable that the first total height $h_{14}$ is substantially equal to the second total height $h_{15}$, however, for brevity and simplicity sake, the desirability of these equal heights will be discussed later in detail after the various embodiments shown in FIGS. 1-3 have been discussed.

The corresponding total heights of the respective solder material and contacts in the various embodiments shown and described with respect to FIGS. 1-3 is desirable because, even though the solder material for each contact has different solder volumes, the total heights of the solder material and the contacts allows the respective WLCSP to easily be coupled to an external electronic device without any other components. For example, if the total heights of the solder material and contacts on a WLCSP were different, it would be more difficult to mount the WLCSP within an electronic device. It would be more difficult because it is preferred that an active surface of a WLCSP is substantially parallel to a surface it is mounted. However, in order for the WLCSP to be substantially parallel to the surface it is mounted, extra components or extra layers of material would have to be supplied on the external electronic device to allow the solder material and the contacts of total different heights to be coupled to the external electronic device such that the active surface of the WLCSP is substantially parallel to the surface it is mounted.

Similarly, if the WLCSP is mounted to a printed circuit board (PCB) and the solder material and the contacts had total heights that were different from each other, it would be more difficult to mount the WLCSP to the PCB for the same reason as discussed above.

These extra layers of material or extra components that would be added to mount the WLCSP that has solder material and contacts with different total heights to the electronic device would cause the allowed tolerances to decrease significantly when placing the WLCSP on the electronic device. This decrease in allowed tolerances makes it much more difficult to mount the WLCSP to the electronic device. Accordingly, in order to mount a WLCSP easily to an external electronic device without providing extra layers of material or extra components, it is desirable to have the total heights of the solder material and the contacts substantially equal to each other. This substantial equivalence in total heights results in a standoff height being substantially the same across the entirety of the WLCSP when it is mounted within the electronic device or coupled to the PCB without the need to add extra layers of material or extra mounting components.

Figure 4A:
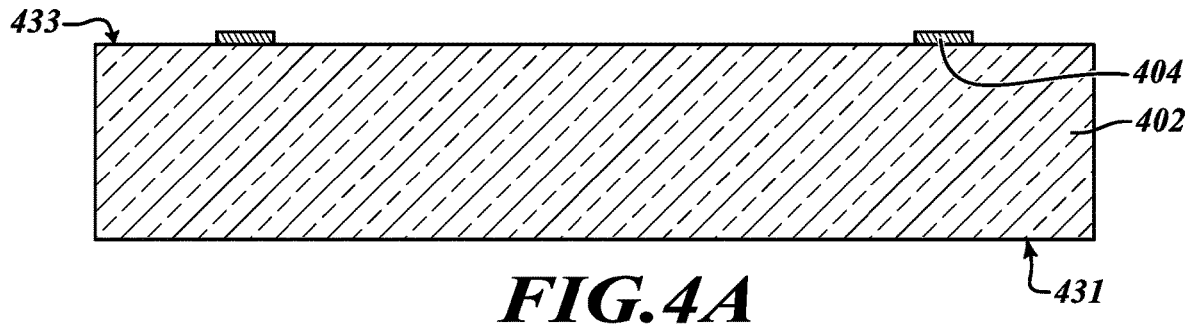
FIGS. 4A-4N are cross-sectional views illustrating a method of forming a WLCSP, such as the WLCSP shown in FIG. 1, in accordance with one or more embodiments.
Figure 4B:
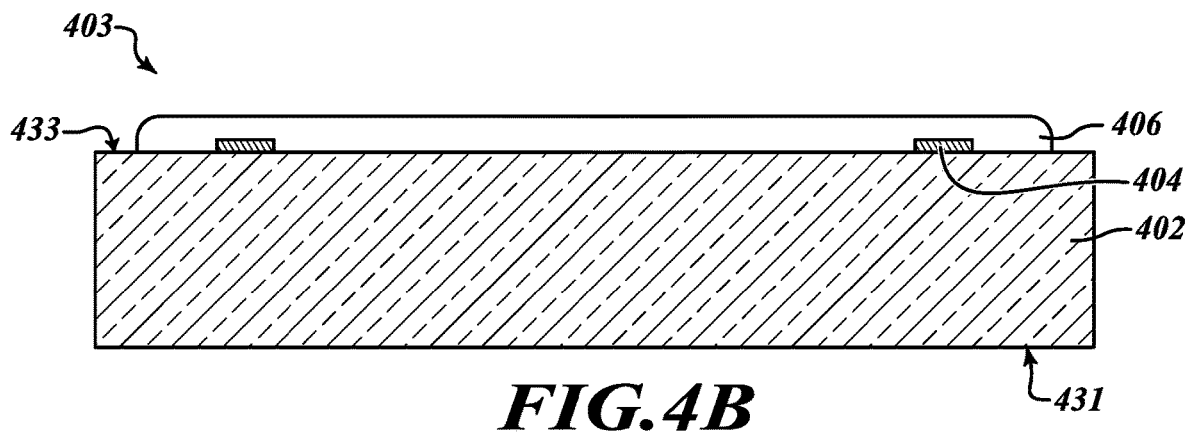
Figure 4C:
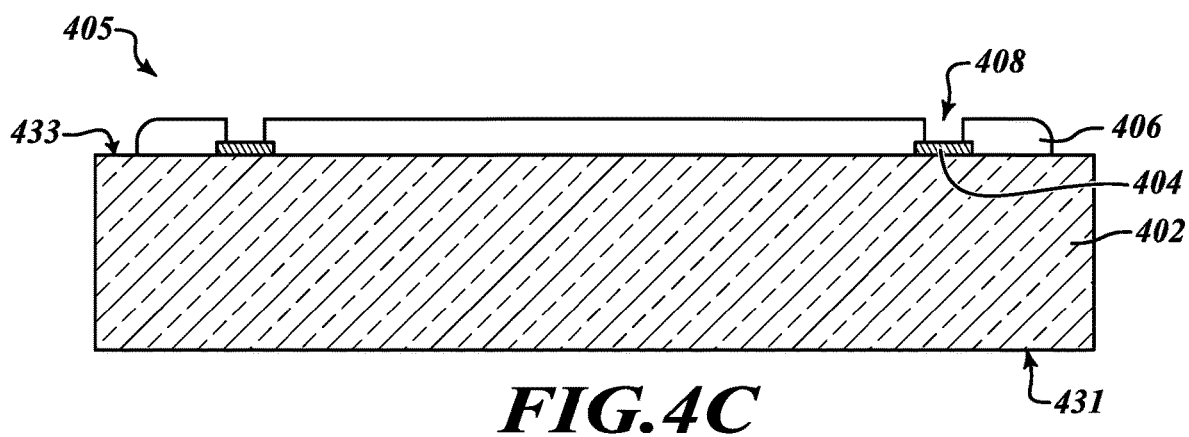
Figure 4D:
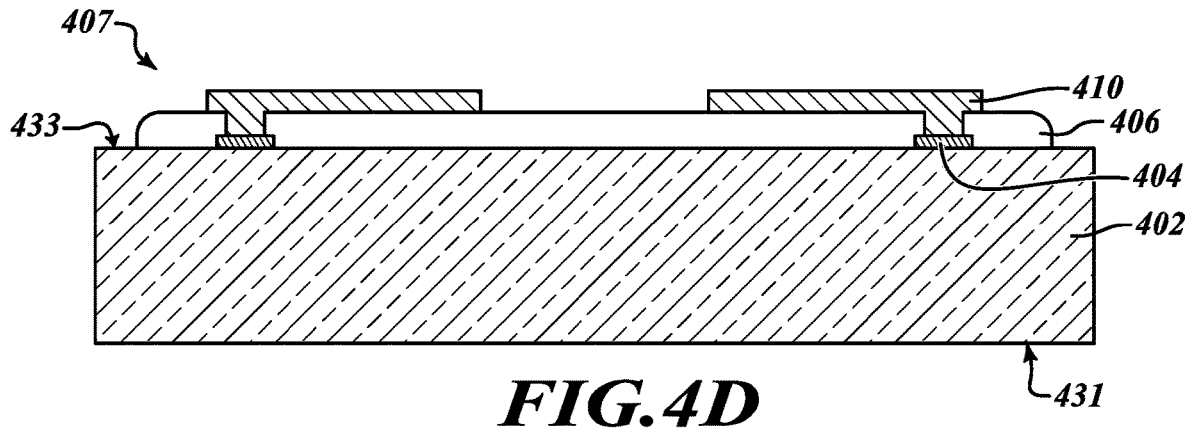
Figure 4E:
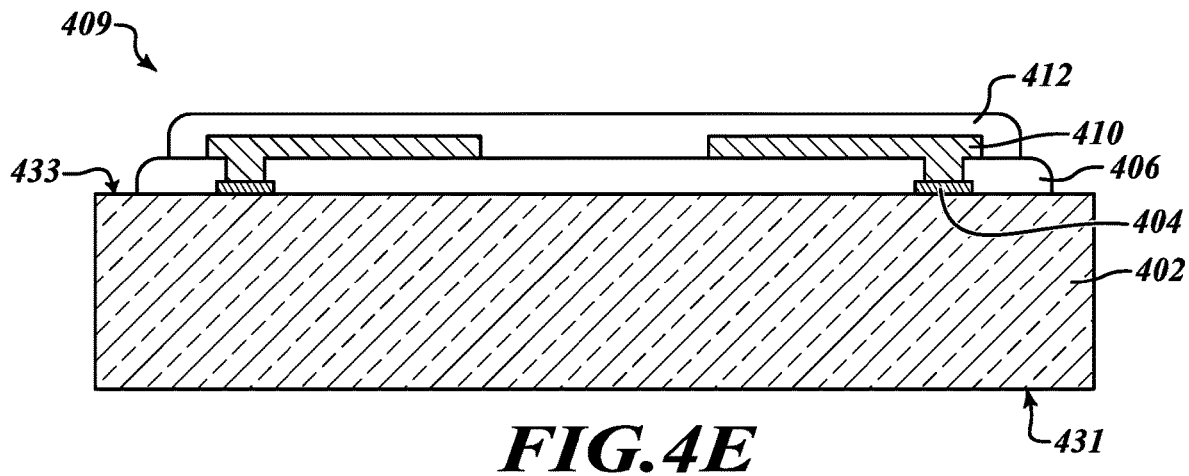
Figure 4F:
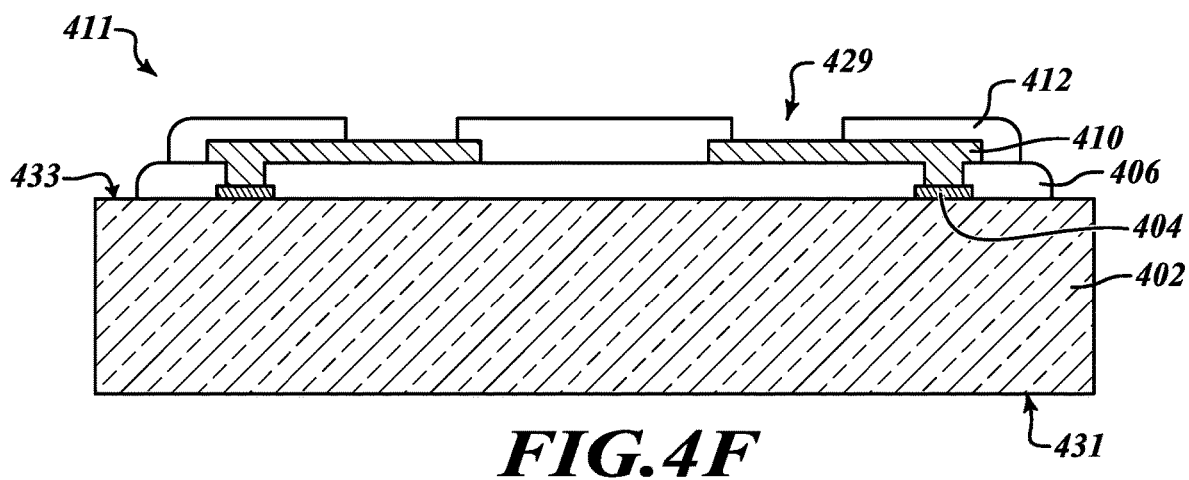
Figure 4G:
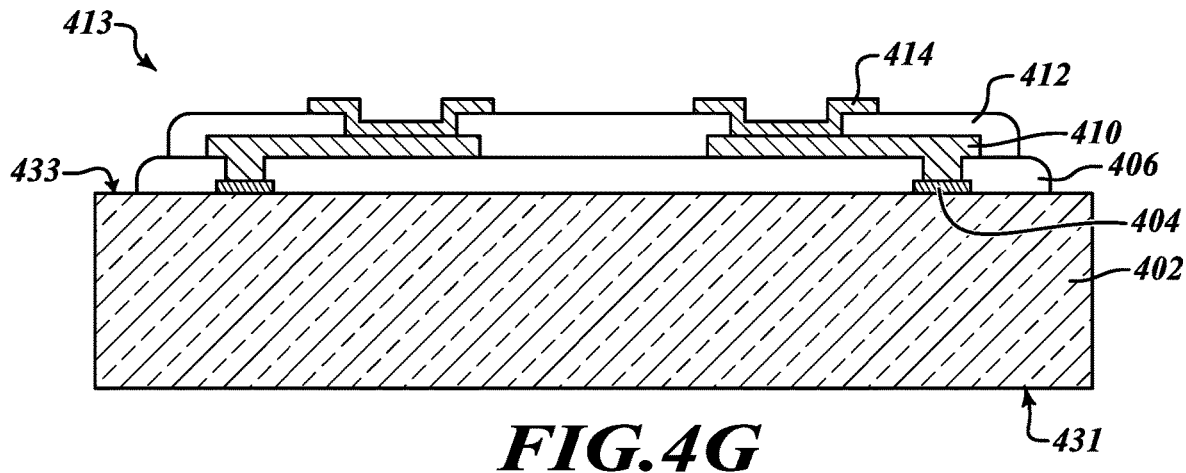
Figure 4H:
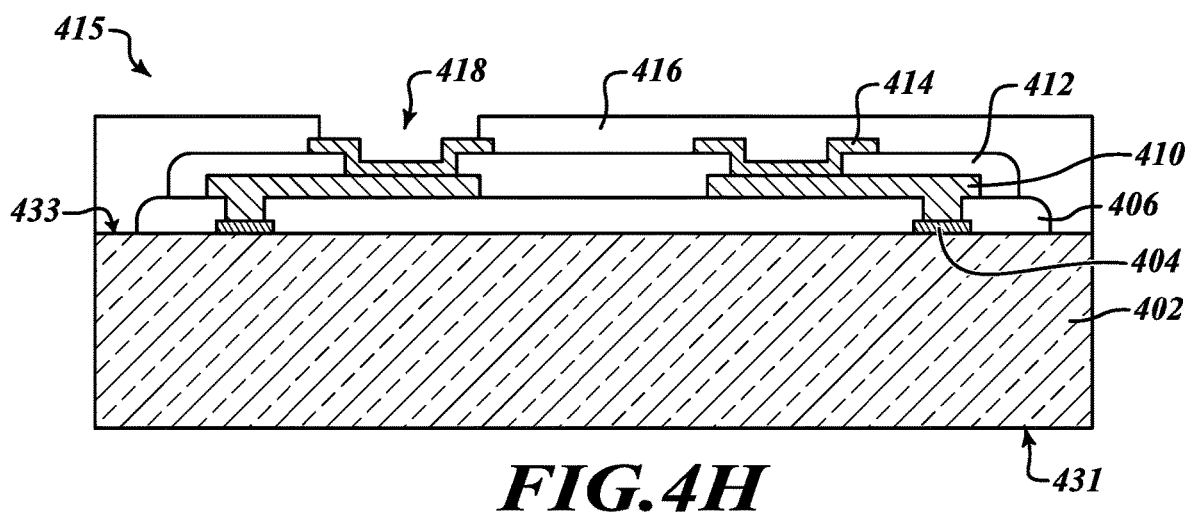
Figure 4I:
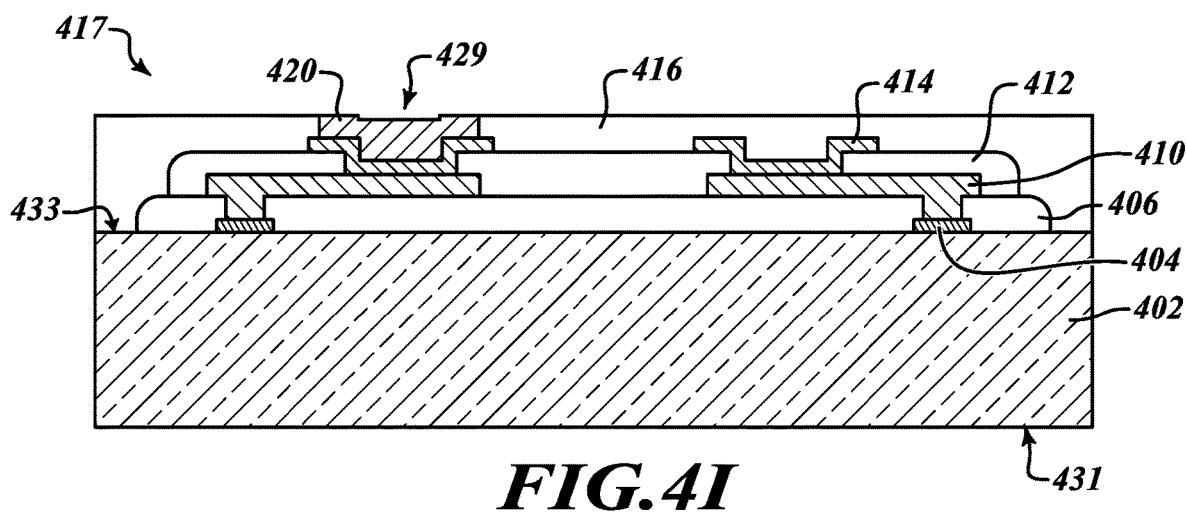
Figure 4J:
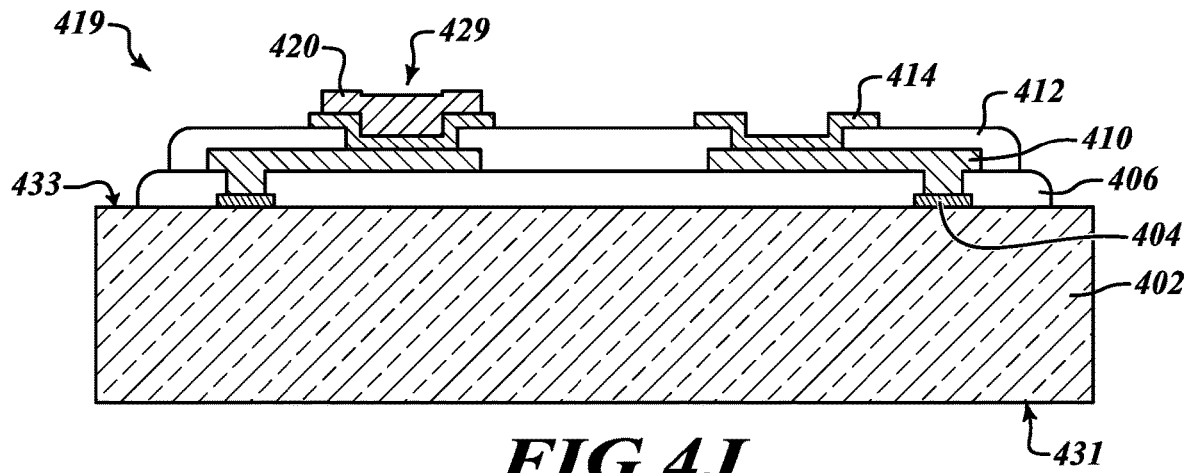
Figure 4K:
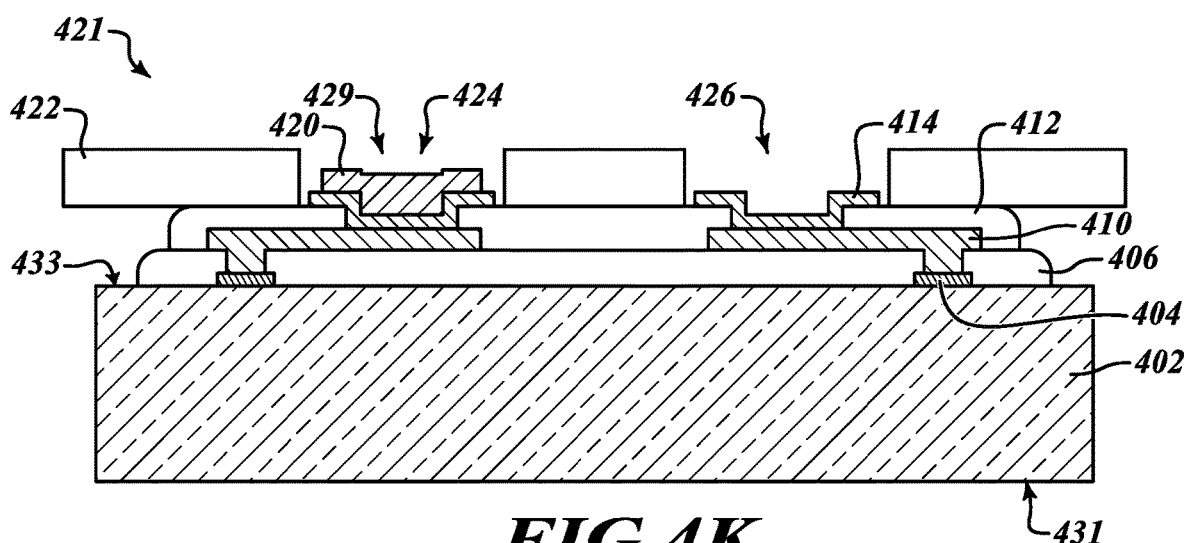
Figure 4L:
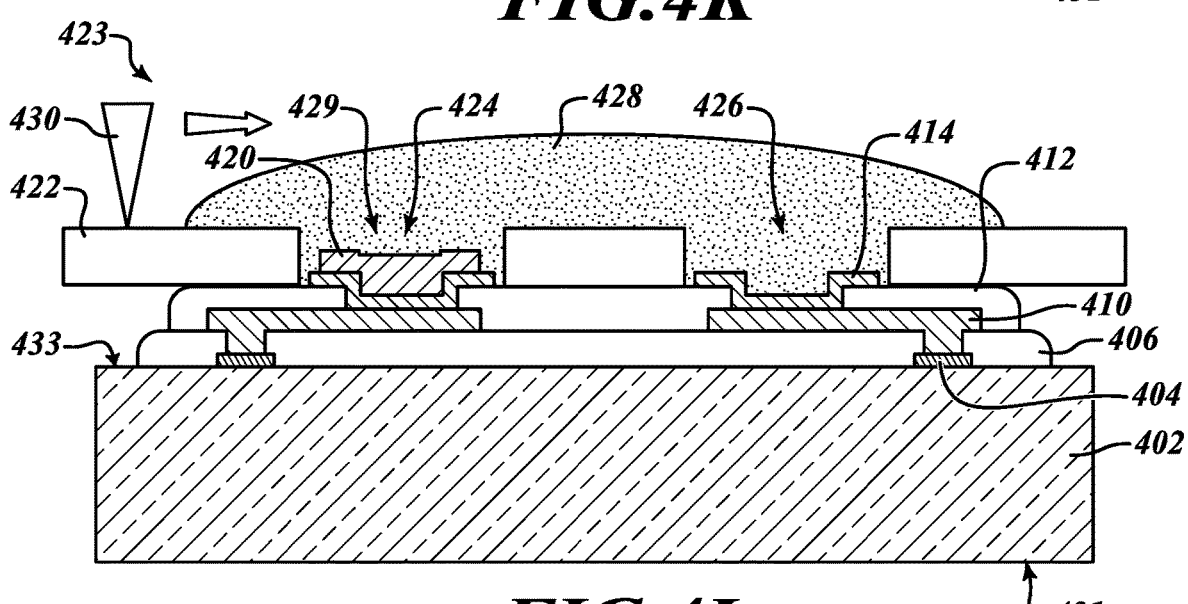
Figure 4M:
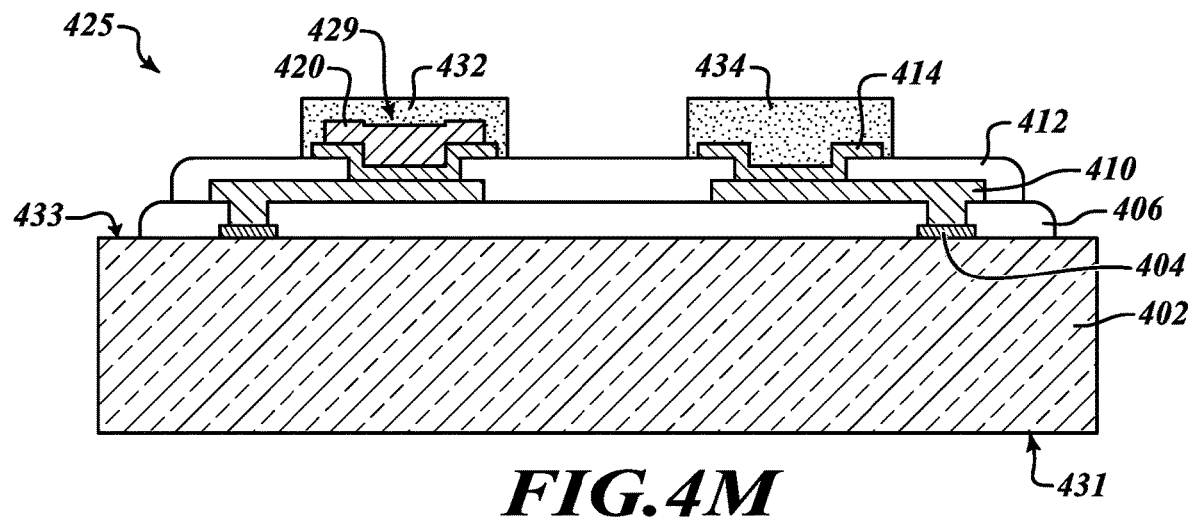
Figure 4N:
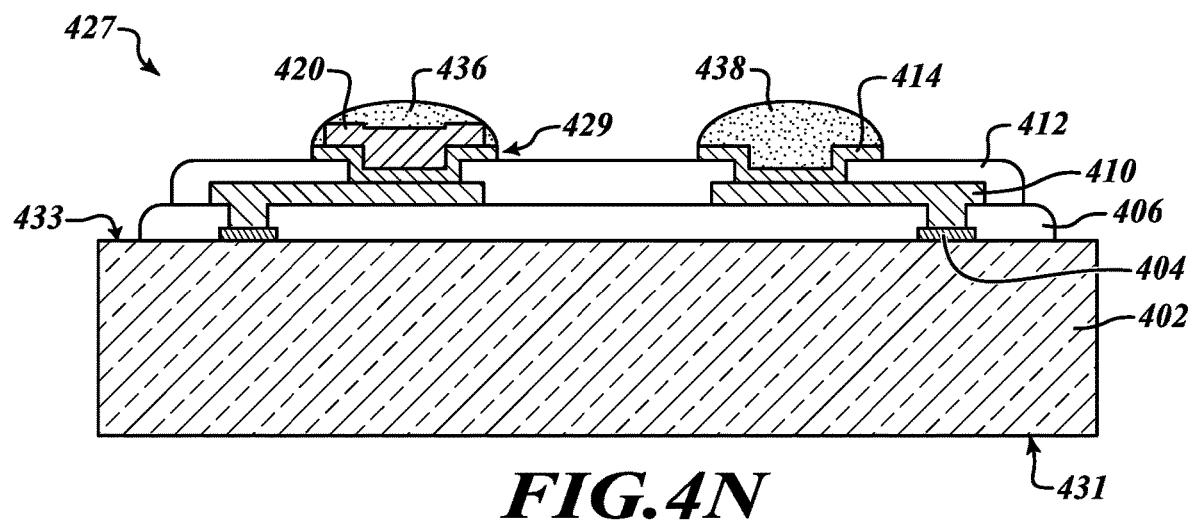

FIGS. 4A-4N illustrate a method of forming a semiconductor device package, such as a WLCSP similar or the same as the WLCSP 100 shown in FIG. 1. While the method illustrated in FIGS. 4A-4N may be described with respect to a WLCSP similar to the WLCSP 100 of FIG. 1, it will be readily appreciated that in various embodiments of the present disclosure, the method can be utilized or adapted to form semiconductor device packages having various different structures or features, including, for example, the WLCSPs 200, 300 illustrated in FIGS. 2 and 3. Accordingly, for simplicity sake and brevity, the different steps for forming the WLCSPs 200, 300 in FIGS. 2 and 3 will be discussed in comparison to the steps utilized in the method of forming a WLCSP similar to or the same as the WLCSP 100 illustrated in FIG. 1.

FIG. 4A illustrates a die 402 that includes an active surface 433 and a passive surface 431. The active surface 433 and the passive surface 431 face away from each other. A plurality of contact pads 404 are on the active surface 433 of the die 402. Each respective contact of the plurality of contacts 404 is coupled to active and passive components within the die 402. Although the active and passive components are not shown in the die 402, the active and passive components may include resistors, transistors, sensors, inductors, capacitors, electrical connections, micro-electro-mechanical systems (MEMS), or any other active and passive components that may be present within the die 402.

In step 403 illustrated in FIG. 4B, a repassivation or passivation layer 406 is formed on the active surface 433 of the die 402. However, for simplicity sake and brevity, the layer of material formed on the active surface 433 of the die 402 will be referred to as a first repassivation layer 406. The first repassivation layer 406 may be formed by a chemical process, an irradiation process, a vapor deposition process, a deposition process, or any other repassivation or passivation layer formation technique. The first repassivation layer 406 is formed to cover the plurality of contact pads 404 on the active surface 433 of the die 402. Although in this embodiment the repassivation layer 406 does not extend to the edges or sidewalls of the die 402, in other alternative embodiments, the repassivation layer 406 may extend to the sidewalls or the edges of the die 402. The repassivation layer 406 may be an insulating material, a corrosion resistant material, a semiconductor material, a dielectric material, or some other material altogether.

After step 403 in which the first repassivation layer 406 is formed, in step 405 openings 408 are formed in the first repassivation layer 406 as illustrated in FIG. 4C. The openings 408 may be formed by selectively removing portions of the first repassivation layer 406. Portions of the repassivation layer 406 may be selectively removed, for example, by a chemical etching, a photoresist etching, wet etching technique, a plasma etching technique, or any other etching technique configured to remove a portion of the first repassivation layer 406. Alternatively, a removal tool may be utilized to form the openings 408 in the first repassivation layer 406 instead of an etching technique, or some other removal technique may be utilized to remove portions of the first repassivation layer 406 to form the openings 408.

If an etching technique is utilized to form the openings 408 in the first repassivation layer 406, multiple resist layers, insulating layers, dielectric layers, semiconductor layers, or sacrificial layers may be stacked on the first repassivation layer 406 to form the openings 408 and then later removed after forming the openings 408. For example, a mask layer may be formed on the first repassivation layer 406 and a photoresist layer may be formed on the mask layer. The photoresist layer may then be exposed to light or UV light to remove a portion of the photoresist layer to expose a portion of the mask layer. The portion of the mask layer that is exposed may then be removed or patterned to expose a portion of the repassivation layer 406. The photoresist layer is then removed, and after the photoresist layer is removed, the portion of the first repassivation layer 406 that is exposed may be removed, patterned, or etched to expose a respective contact pad of the plurality of contact pads 404. The removal of the portion of the first repassivation layer 406 forms the openings 408 that are aligned with the respective contacts of the plurality of contacts 404. Each opening of the plurality of openings 408 exposes and is aligned with at least one respective contact pad of the plurality of contact pads 404 on the active surface 433 of the die 402.

In some embodiments, the openings 408 have a width that is less than a width of the contact pads 404. In some embodiments, the width of the openings 408 may be greater than the width of the contact pads 404, and, in other embodiments, the openings 408 may have a width that is substantially equal to the width of the contact pads 404.

However, in other alternative embodiments, some of the openings 408 may have a width that is greater than the width of the contact pads 404, some of the openings 408 may have a width that is less than the width of the contact pads 404, and some of the openings 408 may have a width that is substantially equal to the width of the contact pads 404. Accordingly, any combination of openings 408 with varying widths may be utilized to expose each respective contact pad of the plurality of contact pads 404 on the active surface 433 of the die 402.

After step 405 in which the openings 408 are formed in the first repassivation layer 406 to expose the plurality of contact pads 404, in step 407 illustrated in FIG. 4D an RDL 410 of conductive material is formed on the first repassviation layer 406 and the plurality of contact pads 404. The RDL 410 includes several portions of conductive material. Each respective portion of the RDL 410 is coupled to at least one respective contact pad of the plurality of contact pads 404. However, respective portions of RDL 410 may be coupled to multiple respective contact pads of the plurality of contact pads 404. The RDL 410 extends through and fills the openings 408, which allows the RDL 410 to be coupled to the plurality of contacts 404. Each respective portion of the RDL 410 is laterally separated and spaced from other respective portions of the RDL 410 to avoid short circuiting or cross-talk between the different portions of the RDL 410 so that the active components and passive components of the die 402 function properly.

After step 407 in which the RDL 410 is formed on the first repassivation layer 406, in step 409 a second repassivation layer 412 is formed on the first repassivation layer 406 and the RDL 410 as illustrated in FIG. 4E. Although as illustrated in FIG. 4E the second repassivation layer 412 does not extend to the edges or sidewalls of the die 402 or extends to the edges and sides of the first repassivation layer 406, in other embodiments, the second repassivation layer 412 may extend to the sidewalls or the edges of the die 402, the edges and sides of the first repassivation layer 406, or both. The second repassivation layer 412 may be an insulating material, a corrosion resistant material, a semiconductor material, a dielectric material, or some other material altogether.

Similar to the first repassivation layer 406, the second repassivation layer 412 may be formed by a chemical process, an irradiation process, a vapor deposition process, a deposition process, or any other repassivation or passivation layer formation technique. In some embodiments, the first repassivation layer 406 and the second repassivation layer 412 may be formed of a same material. The second repassivation layer 412 is formed to cover the RDL 410.

After step 409 in which the second repassivation layer 412 is formed on the RDL 410 and the first repassivation layer 406, in step 411 openings 429 are formed in the second repassivation layer 410 as illustrated in FIG. 4F. The openings 429 may be formed by a chemical etching, a photoresist etching, wet etching technique, a plasma etching technique, or any other etching technique configured to remove a portion of the second repassivation layer 412 in a similar manner as discussed above with respect to the first repassivation layer 406. Alternatively, a removal tool may be utilized to form the openings 429 in the second repassivation layer 412 instead of an etching technique, or some other removal technique may be utilized to remove portions of the second repassivation layer 412 to form the openings 429 in a similar manner as discussed above with respect to the first repassivation layer 406. Because the openings 429 in the second repassivation layer 412 are formed in a similar manner as the openings 408 in the first repassivation layer 406, for simplicity and brevity sake, the details of forming the second repassivation layer 412 will not be discussed in further detail. The removal of the portions of the second repassivation layer 412 forms the openings 429 that are aligned with the respective portions of the RDL 410. Each respective opening of the plurality of openings 429 exposes and is aligned with a respective portion of the RDL 410 on the active surface 433 of the die 402.

In some embodiments, the openings 429 have a width that is greater than a width of the contact pad 404 and a width of the openings 408 formed to expose the contact in step 408. In some embodiments, the width of the openings 429 may be substantially equal to the width of the contact pad 404 or the width of the openings 408, and, in another alternative embodiment, the openings 429 may have a width that is less than the width of the contact pads 404 or the width of the openings 408. However, in other alternative embodiments, some of the openings 429 may have a width that is greater than the width of the contact pads 404 and the openings 408, some of the openings 429 may have a width that is less than the width of the contact pads 404 or the openings 408, and some of the openings 429 may have a width that is substantially equal to the width of the contact pads 404 or the openings 408. In other words, any combination of openings 429 with varying widths may be utilized to expose each respective portion of the RDL 410 on the active surface 433 of the die 402.

After step 411 in which the openings 429 are formed in the second repassivation layer 412 to expose portions of the RDL 410, in step 413 a first contact structure 414 is formed in each respective opening 429 in the second repassivation layer 412. Each respective first contact structure 414 extends into a respective opening 429 in the second repassivation layer 412 and is on a respective portion of the RDL 410. Each first contact structure 414 includes a recess that is aligned with the portion of the RDL 410 that the first contact structure 414 is coupled. However, in other alternative embodiments of the first contact structures 414, the first contact structures 414 may not have recesses that extend towards the active surface 433 of the die 402. In this embodiment, the first contact structures 414 are formed in the openings 429 that were formed to expose the portions of the RDL 410. Each respective first contact structure 414 is coupled to a respective portion of the RDL 410.

Each first contact structure 414 includes portions that are on a surface of the second repassivation layer 412 that faces away from the active surface 433 of the die 402. These portions of the first contact structures 414 increase the surface area of the first contact structures 414 to improve the electrical communication and physical connection between the first contact structure 414 and a solder material or conductive material as will be discussed later in FIGS. 4M and 4N.

The first contact structures 414 may be formed by a vapor deposition technique, a plating deposition technique, or any other deposition technique for forming conductive contact structures. Alternatively, the first contact structures may be formed in a similar fashion to the openings 408 the first repassivation layer 406 by the use of multiple insulating layer, dielectric layers, semiconductor layers, conductive layers, sacrificial layers, or any other layers of material as discussed earlier. However, unlike the removal of portions of the first repassivation layer 406 to form the openings 408, an additive formation technique, which may be one of the deposition techniques discussed earlier, will be utilized in combination with these layers of material to form the first contact structures 414. Some of the first contact structures 414 may be a portion of a contact or a completed contact as will be discussed with respect to FIG. 4I. Accordingly, the first contact structures that are completed contacts may be referred to as first contacts 414.

After step 413 in which the first contact structures 414 are formed in the openings 429 of the second repassivation layer 412, in step 415 a sacrificial layer 416 is formed on the active surface 433 of the die 402 as illustrated in FIG. 4H. The sacrificial layer 416 is formed to cover some of the first contact structures 414 and leave exposed some of the first contact structures 414. Openings 418 are formed in the sacrificial layer 416 to expose some of the first contact structures 414. The sacrificial layer may be formed in a similar fashion to the first repassivation layer 406 as discussed above. The openings 418 in the sacrificial layer 416 may be formed in a similar fashion as discussed with respect to the openings 408 in the first repassivation layer 406. The sacrificial layer 416 may be an insulating layer, an oxide layer, a non-conductive layer, a sacrificial repassivation layer, a sacrificial passivation layer, or some other sacrificial material.

In some embodiments, the first contact structures 414 that are covered by the sacrificial layer 416 are first contacts 414 and the first contact structures 414 that are exposed by the openings 418 in the sacrificial layer 416 are first portions of second contacts 429.

The openings 418 have a width that is less than a width of the first contact structures 414. The openings 418 expose respective recesses of the first contact structures 414. In alternative embodiments, the openings may have a width that is substantially equal to the width of the first contact structures 414, a width that is substantially equal to a width of a recess of the first contact structures 414, or a width that is less than a width of the recess of the first contact structures 414. In some embodiments, a portion of the sacrificial layer is on the portions of the first contact structures 414 on the second repassivation layer 412.

After step 415 in which the sacrificial layer 416 with the openings 418 is formed on the active surface 433 of the die 402, in step 417 second contact structures 420 are formed in the openings 418 aligned with respective first contact structures 414. The second contact structures 420 fill the openings 418 in the sacrificial layer 416. Each respective second contact structure 420 is coupled to at least one respective first contact structure 414 that is exposed by a respective opening 418 in the sacrificial layer 416. The second contact structures 420 may be made of a copper material, a gold material, a silver material, an alloy material, or some other conductive material. The second contact structures 420 may be made of the same conductive material as the first contact structures 414. Each second contact structure 420 is a second portion of a completed second contact 429 and each respective first contact structure 414 coupled to the respective second contact structure is a first portion of the completed second contact 429. Accordingly, the first contact structure 414 and the second contact structure 420 coupled to the first contact structure 414 may be referred to as a second contact 429. The second contact 429 may be referred to as and is a UBM, an external contact, or any other type of contact for mounting a die within an electronic device, a PCB, or another die.

In some embodiments, the second contact structure 420 has a width that is less than the width of the first contact structure 414, and the width of the second contact structure 420 is substantially equal to the width of the opening 418. However, in alternative embodiments, the second contact structure 420 may have a width that is substantially equal to the width of the first contact structure 414 or a width that is greater than the width of the first contact structure 414.

In some embodiments, the second contact structure 420 has a surface with a recess that extends towards the active surface 433 of the die 402. However, in alternative embodiments, the second contact structure 420 may have a surface that does not have a recess.

After step 417 in which the second contact structures 420 are formed in the openings 418 in the sacrificial layer 416, in step 419 the sacrificial layer 416 is removed as illustrated in FIG. 4J. The sacrificial layer 416 may be removed by a removal tool, which may be a laser removal tool, a cutting removal tool, or some other type of removal tool. Alternatively, the sacrificial layer may be removed by an etching process, which may be a wet etching, a chemical etching, an irradiation etching, or some other etching. After the sacrificial layer 416 is removed the respective first contact structures 414, which are first contacts 414, that were covered by the sacrificial layer 416 are again exposed. Alternatively, the sacrificial layer 416 may be a material that deteriorates when exposed to heat and may be removed by being exposed to heat.

After step 419 in which the sacrificial layer is removed, in step 421 a stencil 422 is placed on the second repassivation layer 412 as illustrated in FIG. 4K. The stencil includes a first opening 424 that is aligned with the second contact 429 and a second opening 426 is aligned with the first contact 414. The stencil may be held in place by a sacrificial adhesive material, a temporary adhesive material, a weak adhesive material, or may be held in place by a machine. Alternatively, the stencil 422 may be picked up and held in place by a pick and place machine.

After step 421 in which the stencil 422 is placed on the second repassivation layer 412, in step 423 a solder material 428 is formed on the stencil 422 and fills the first opening 424 and the second opening 426, and the excess solder material is then removed by a squeegee 430. The solder material 428 may be a solder paste material, a conductive paste material, a conductive adhesive material, or some other conductive material that is configured to mount a die within an electronic device, to couple a die to a PCB, or to couple a die to some other external device. The solder material 428 is placed on the stencil 422 to fill the first opening 424 and the second opening 426. The solder material 428 in the first opening 424 and the second opening 426 covers the second contact 429 and the first contact 414, which is closer to the right side of the die 402. An excess amount of solder material is placed on the stencil to fill the first opening and the second opening to increase the likelihood that the solder material will be coupled to the second contact 429 and the first contact 414.

When the excess amount of solder material 428 is utilized, the excess amount of solder material 428 is removed. The excess amount of solder material 428 is removed by a squeegee 430. The squeegee 430 is pulled or pushed across the surface of stencil 422 that faces away from the active surface 433 of the die 402. As the squeegee 430 is pulled or pushed across this surface of the stencil 422, the excess of the solder material is removed. After the excess solder material 428 is removed, the solder material 428 present within the first opening 424 and the second opening 426 remains. The surfaces of the solder material 428 in the first opening 424 and the second opening 426 facing away from the active surface 433 of the die 402 are substantially flush with the surface of the stencil 422 facing away from the active surface 433 of the die 402.

Once the excess amount of solder material 428 is removed by the squeegee 430, the solder material 428 in the first opening 424 and the second opening 426 is allowed to cure before the stencil 422 is removed in the next step 425.

After step 423 in which the solder material 428 is placed on the stencil 422 and excess solder material 428 is removed by the squeegee 430, in step 425 the stencil 422 is removed from the second passivation layer 412. The stencil 422 may be removed by a pick and place machine that removes the stencil 422 from the second repassivation layer 412. Once the stencil 422 is removed, a first solder portion 434 is coupled to a first contact 414 and a second solder portion 432 is coupled to the second contact 429. The surfaces of the first solder portion 434 and the second solder portion 432, which are facing away from the active surface 433 of the die 402, are substantially co-planar. In other words, the total height of the first contact 414 and the first portion of solder material 434 is substantially equal to the total height of the second contact 429 and the second solder portion 432. The second solder portion 432 has a volume that is less than the first solder portion 434 because the second contact 429 has a greater volume than the first contact 414, and, when the squeegee 430 removes the excess solder material 428, there is less solder material 428 in the first opening 424 than the solder material 428 in the second opening 426. The solder material 428 in the first opening 424 and on the second contact 429, which corresponds to the second solder portion 432, and the solder material 428 in the second opening 426 and on the first contact 414, which corresponds to the first solder portion 434, both have a surface that is flush with a surface of the stencil 422 that faces away from the active surface 433 of the die 402.

Since the solder material 428 is allowed to cure in the first opening 424 and the second opening 426 before the stencil is removed, the first solder portion 434 and the second solder portion 432 have sides that are transverse the active surface 433 of the die 402.

In some embodiments, the second solder portion 432 covers the second contact 429 and sides of the second contact 429. The first solder portion 434 covers the first contact 414 and sides of the first contact 414. The second contact 429 extends into the second solder portion 432. The first solder portion 434 extends into the recess of the first contact 414. In an alternative embodiment, the second solder portion 432 covers the second contact 429 and has a width that is substantially equal to a width of the second contact 429. In another alternative embodiment, the first solder portion 434 covers the first contact 414 and has a width that is substantially equal to a width of the first contact 414. In yet another alternative embodiment, the second solder portion 432 has a width that is less than the second contact 429 and the first solder portion 434 has a width that is less than the first contact 414.

After step 425 in which the solder material 428 is cured to form the first solder portion 434 and the second solder portion 432 and the stencil 422 is removed, in step 427 the first solder portion 434 and the second solder portion 432 are reflowed to form a first solder bump 438 on the first contact 414 and a second solder bump 436 on the second contact 429. The first solder bump 438 and the second solder bump 436 may be referred to as a first conductive structure and a second conductive structure, respectively. The first solder portion 434 and the second solder portion 432 may be reflowed by placing the die in a reflow oven, or exposing the solder material to a heat source that would result in the reflow of the solder portions 432, 434. This reflow process causes first solder portion 434 and the second solder portion 432 in FIG. 4M to become a first solder bump 438 and a second solder bump 436 as shown in FIG. 4N.

As illustrated in FIG. 4N, the first solder bump 438 covers the first contact structure 414 and the second solder bump 436 covers the second solder structure 420. In some embodiments the first solder bump 438 and the second solder bump 436 leave exposed side surfaces of the first contact structures 414 and the second contact structures 420, and the first solder bump 438 and the second solder bump 436 do not contact the second repassivation layer 412. However, in some other embodiments, the first solder bump 438 and the second solder bump 436 may cover side surfaces of the first contact structures 414 and the second contact structures 414, may be a combination of covering the sidewalls or leaving the sidewalls exposed of the first contact structures 414 and the second contact structures 420, and may be in direct contact with the second repassivation layer 412.

The above method may be altered to form the embodiment of the WLCSP 200 in FIG. 2 by removing step 413, and, instead, going from step 411 to step 417 to form the UBM 212. Alternatively, the above method may be altered to form the embodiment of the WLCSP 300 in FIG. 3 by removing steps 407, 409, 411, and, instead, forming the first contact 311 and the second contact 312 on the contact pads 304.

Figure 5:
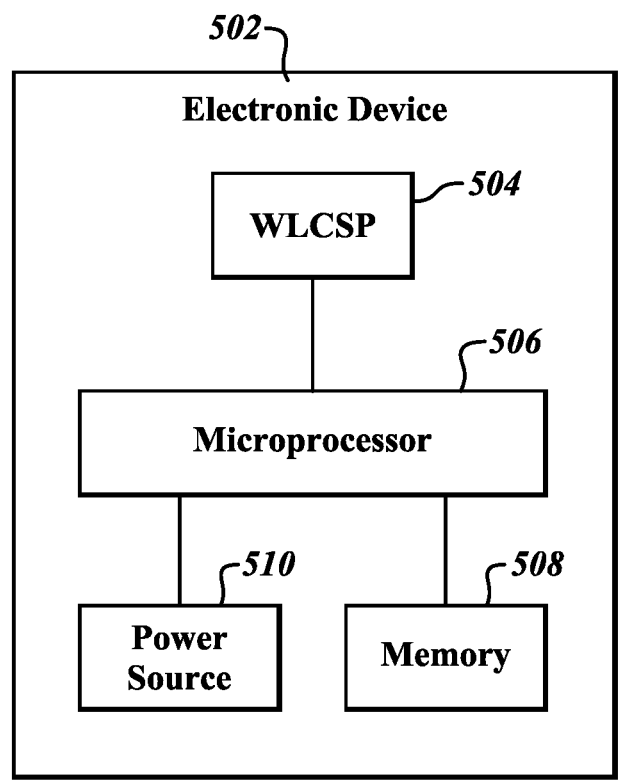
FIG. 5 is a schematic block diagram illustrating an electronic device including a WLCSP, in accordance with one or more embodiments.

FIG. 5 is a block diagram illustrating an electronic device 502 that includes a WLCSP 504, a microprocessor 506 coupled to the WLCSP 504, a memory that is coupled 508 to the microprocessor 506, and a power source 510 coupled to the microprocessor 506. The microprocessor 506 receives signals from the WLCSP 504 and the microprocessor 506 sends signals to the WLCSP 504. The microprocessor 506 sends signals to the memory 508 to be stored and the memory 508 sends signals to the microprocessor 506 such as instruction signals. The power source 510 supplies power to the microprocessor 506 and the microprocessor distributes the power received from the power source to the other components of the electronic device such as the WLCSP 504 and the memory 508.

While the following discussion focuses on the embodiment of the WLCSP 100 in FIG. 1, the following discussion applies to the respective components of the alternative embodiments of the WLCSPs 200, 300 in FIGS. 2-3 and 4N. The following focuses on the board level reliability of the WLCSPs 100, 200, 300, and board level reliability includes resistance to thermal cycling and resistance to failure due to dropping. However, board level reliability may include considering other factors that may cause a likelihood of failure in the WLCSPs 100, 200, 300 to increase or decrease. The following discussion also applies to other alternative embodiments that are not explicitly disclosed in this present disclosure but instead are inherent or implicit the present disclosure.

As discussed above with respect to FIG. 1, the total height $h_6$ of the first contact 112 and the first conductive structure 118 on the first contact is substantially equal to the total height $h_5$ of the second contact 117 and the second conductive structure 120. However, the height $h_2$ of the first contact 112 is less than the height $h_1$ of the second contact 117, and the volume of the first conductive structure 118 is greater than the volume of the second conductive structure 120. The second contact 117 with the greater height $h_1$ and larger volume than the first contact 112 has greater resistance to thermal cycling than the first contact 112 because less conductive material is used to form the second conductive structure 120 on the second contact 117 than the first conductive structure 118 on the first contact 112. The conductive material may be a solder material. The second conductive structure 120 is formed using less solder or conductive material compared to the first conductive structure 118. This reduction in solder or conductive material reduces the likelihood of failure in an electrical connection due to thermal cycling because the solder or conductive material is more susceptible to failure due to stresses created by expansion and contraction of the solder or conductive material by thermal cycling, which means having less solder or conductive material to form the second conductive structure 120 reduces the chance of failure due to thermal cycling. Accordingly, the larger volume of the second contact 117 compared to the first contact 112 and lesser volume of the second conductive structure 120 compared to the first conductive structure 118 increases the resistance of the second contact 117 and the second conductive structure 120 to thermal cycling when compared to the first contact 112 and the first conductive structure 118.

The larger volume of the second contact 117 compared to the first contact 112 increases the electromigration capabilities of the second contact 117 when compared to the first contact 112. The larger volume of the second contact 117, which may be made of a copper material, a copper alloy, or some other conductive material, lowers the overall electrical resistance of the second contact 117 in combination with the second conductive structure 120.

The second contact 117 is generally positioned at the corner bumps or connections of the WLCSP 100 because of the increased resistance to thermal cycling. The increased thermal cycling resistance at corners of the WLCSP 100 due to the second contact 117 is desired because the deformation, contraction, or expansion of the WLCSP 100 and the solder material 428 and the effects of these are usually larger at the corners of the WLCSP 100 than near the center of the WLCSP 100. Accordingly, this increase in resistance to thermal cycling of the second contact 117 reduces the probability of failure due to thermal cycling in the bump connections at the corners of the WLCSP 100. Failures due to thermal cycling may include cracking in the bump connection, delamination of the bump connections due to expansion, contraction, or deformation in the die or bump connection, or any other form of failure that may be a result of thermal cycling.

The second contact 117 and the second conductive structure 120 form a stronger physical connection to an external component than the first contact 112 and the first conductive structure 118. The connection is stronger because the second contact 117, which is larger than the first contact 112, is made of a physically stronger material than the portions of conductive material. Accordingly, the larger second contact 117 and the second conductive structure 120 forms a stronger physical connection to the external component when compared to the first contact 112 and the first conductive structure 118.

While the second contact 117 may be positioned at the corner of the WLCSP 100, other contacts with the same or similar structure as the second contact 117 may be positioned anywhere on the WLCSP 100 as desired to reduce the likelihood of failure in connections due to thermal cycling. For example, the contact 212 in FIG. 2 and the first contact 311 in FIG. 3 may have similar positioning as the second contact 117 of the WLCSP 100 as discussed earlier.

While the first contact 112 has less resistance against thermal cycling, less electromigration, and is less physically strong than the second contact 117 as discussed above, the first contact 112 with the first conductive structure 118 has a greater resistance to failure due to the WLCSP 100 being dropped when compared to the second contact 117 and the second conductive structure 120. For example, dropping may result due to the WLCSP 100 being dropped when being shipped, when mounted within an electronic device, when the WLCSP 100 is run through a drop test, or when the WLCSP 100 comes under forces and stresses due to being dropped in any other instance.

The first contact 112 with the first conductive structure 118 is more resistant to dropping than the second contact 117 with the second conductive structure 120 because the first conductive structure 118 has a greater volume than the second conductive structure 120. The larger volume of the first conductive structure 118 increases resistance to dropping because the conductive material, which is generally a solder material, has the ability to more readily and easily absorb stresses as a result of being dropped than either the conductive material that makes up the first contact 112 or the second contact 117. In other words, the conductive material of the first conductive structure 118 can deform, expand, and compress with a lower likelihood of failure than the first contact 112, the second contact 117, or the second conductive structure 120. The lower likelihood of failure results because the first conductive structure 118 has a greater volume than the second conductive structure 120, and due to the larger volume, the first conductive structure 118 is more resistant to stresses and forces caused by dropping than the second conductive structure 120.

The first contact 112 with the first conductive structure 118 is generally placed near the center of the WLCSP 100. While the first contact 112 with the first conductive structure 118 may be positioned near the center of the WLCSP 100, contacts with the same or similar structure as the first contact 112 may be positioned anywhere on the WLCSP 100 as desired to reduce the likelihood of failure in electrical mounting connections due to drop failure. For example, the second conductive structure 216 in FIG. 2 and the second contact 312 with the second conductive structure 316 in FIG. 3 may have similar positioning as the first contact 112 with the first conductive structure 118 as discussed above with respect to FIG. 1. In other words, to summarize, the larger volume of the first conductive structure 118 compared to second conductive structure 120 means that the first conductive structure 118 is better at absorbing stresses and forces caused by dropping than the second conductive structure 120. Accordingly, the first conductive structure 118 and the first contact 112 have a greater resistance to dropping stresses and forces compared to the second conductive structure 120 and the second contact 116.

In view of the discussion above, by utilizing contacts with different heights and volumes, portions of conductive material of different heights and volumes, but total heights and volumes of the combination of the respective contacts and their corresponding portions of conductive material, increases the resistance of the respective connections of the respective WLCSP against thermal cycling failures and drop failures. The different combinations in different positions maintain a desired board level reliability and electromigration as well. The total height of the respective contacts and respective conductive structures being substantially equal to each other is desired and allows for the embodiments of the respective WLCSP to be easily mounted to an external electronic device with a proper standoff height.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a die including an active surface with a plurality of contact pads and a passive surface;
a first repassivation layer on the active surface of the die;
a plurality of conductive layers coupled to the plurality of contact pads of the die, the conductive layer is on the first repassivation layer;
a second repassivation layer on the first repassivation layer and on the plurality of conductive layers;
a first contact coupled to one of the plurality of conductive layers, the first contact having a first height, the first contact extends into the second repassivation layer;
a second contact coupled to one of the plurality of conductive layers, the second contact having a second height that is less than the first height, the second contact extends into the second repassivation layer;
a first conductive structure on the first contact, the first conductive structure having a third height; and
a second conductive structure on the second contact, the second conductive structure having a fourth height that is greater than the third height.

2. The device of claim 1, wherein:
a first total height of the first contact and the first conductive structure that extends from a surface of the first contact coupled to the conductive layer to a first point that is furthest away from the active surface of the die; and
a second total height of the second contact and the second conductive structure that extends from a surface of the second contact coupled to the conductive layer to a second point that is further away from the active surface of the die, the second total height is substantially equal to the first total height.

3. The device of claim 1, wherein the second contact includes a recessed portion that extends into the second contact towards the active surface of the die.

4. The device of claim 1, wherein:
the first conductive structure has a first point that is furthest away from the first contact; and
the second conductive structure has a second point that is furthest away from the second contact and is substantially co-planar with the first point of the first contact.

5. The device of claim 1, wherein:
the fourth height of the second conductive structure is greater than the second height of the second contact; and
the third height of the first conductive structure is less than the first height of the first contact.

6. A device, comprising:
a die having an active surface and a passive surface;
a plurality of contact pads on the active surface of die;
a first repassivation layer on the active surface of the die;
a first conductive layer on the first repassivation layer and coupled to one of the plurality of contact pads;
a second conductive layer on the first repassivation layer and coupled to one of the plurality of contact pads;
a second repassivation layer on the first repassivation layer, the first conductive layer, and the second conductive layer; and
a first contact extending into the second repassivation layer and coupled to the first conductive layer,
a first solder structure on the first contact, the first solder structure having a first height and a first point that is furthest away from the active surface of the die; and
a second solder structure on the active surface of the die, the second solder structure having a second height greater than the first height and a second point that is furthest away from the active surface of the die, the second point being substantially co-planar with the first point, the second solder structure is separated from the first contact by the second repassivation layer.

7. The device of claim 6,
wherein the first contact includes a third height, and the device further comprises a second contact with a fourth height less than the third height of the first contact, the second contact is physically coupled to the second solder structure.

8. The device of claim 6, wherein:
the first contact is physically coupled to the first solder structure, the first contact having a third height, the first contact located between the first conductive layer and the first solder structure.

9. The device of claim 8, further comprising a second contact that is physically coupled to the second conductive layer and that is physically coupled to the second solder structure, the second contact having a fourth height that is less than the third height, the second contact located between the second respective contact pad and the second solder structure.

10. The device of claim 9, wherein a first total height of a first sum of the first height and the third height is equal to a second total height of a second sum of the second height and the fourth height.

11. The device of claim 8, wherein the second solder structure is physically coupled to the second conductive layer.

12. The device of claim 11, wherein the second solder structure is within the second repassivation layer.

13. The device of claim 11, wherein a first total height of a first sum of the first height and the third height is equal to the second height of the second solder structure.

14. A method, comprising:
forming a first conductive structure on an active side of a die including:
forming a first contact structure; and
forming a first solder structure with a first height, with a first point furthest away from the active side of the die, and on the first contact structure; and
forming a second conductive structure on the active side of the die including:
forming a second solder structure with a second height that is greater than the first height and a second point furthest away from the active side of the die, the second point being substantially co-planar with the first point in a plane that is parallel to the active side of the die;
forming the first solder structure and forming the second solder structure simultaneously including:
placing a stencil on the an active side of the die, the stencil having openings aligned with the first contact structure and the second contact structure on the active side of the die;
filling the openings of the stencil with a solder material; and
removing excess portions of the conductive material on the stencil simultaneously forming the first solder structure with the first height and the second solder structure with the second height.

15. The method of claim 14, wherein forming the first and the second conductive structures further comprises removing the excess portions of the conductive material on the stencil by a squeegee.

16. The method of claim 14, wherein:
forming the first contact structure includes forming the first contact structure with a third height; and
forming the second conductive structure further includes forming a second contact structure with a fourth height less than the third height on the active side of the die.

17. The method of claim 16, wherein:
forming the second conductive structure includes forming the second solder structure on the second contact structure.

18. The method of claim 16, wherein a first sum of the first height of the first solder structure and the third height of the first contact structure is substantially equal to a second sum of the second height of the second solder structure and the fourth height of the second contact structure.

19. The method of claim 14, further comprising:
forming a first repassivation layer on the active side of the die covering a plurality of contact pads of the die;
forming a plurality of first openings in the first repassivation layer, each respective first opening of the plurality of first openings aligned with a respective contact pad of the plurality of contact pads;
forming a plurality of first conductive layers in the plurality of openings and on the plurality of contact pads;
forming a second repassivation layer on the plurality of first conductive layers and the first repassivation layer;
forming a plurality of second openings in the second repassivation layer, each respective second opening of the plurality of second openings aligned with a respective first conductive layer of the plurality of first conductive layers;
forming a plurality of second conductive layers in the plurality of second openings and on the plurality of first conductive layers;
forming a resist layer on the second repassivation layer and the plurality of second conductive layers;
forming a third opening in the resist layer aligned with one of the plurality of second conductive layers; and
forming a third conductive layer in the third opening and on the one of the plurality of second conductive layers.

20. The method of claim 14, further comprising:
forming a repassivation layer on a first contact pad and on a second contact pad on the active side of the die;
forming a first opening in the repassivation layer on the first contact pad and a second opening in the repassivation layer on the second contact pad;
forming a first contact with a first height on the first contact pad, the first contact coupled to the first contact pad and the first conductive structure; and
forming a second contact with a second height greater than the first height on the second contact pad, the second contact coupled to the second contact pad and the second conductive structure,
wherein a sum of the first height of the first conductive structure and the third height of the first contact is substantially equal to a sum of the second height of the second conductive structure and the fourth height of the second contact.

* * * * *

UNITED STATES PATENT AND TRADEMARK OFFICE
CERTIFICATE OF CORRECTION

PATENT NO. : 11,581,280 B2  
APPLICATION NO. : 17/104968  
DATED : February 14, 2023  
INVENTOR(S) : David Gani Page 1 of 1

It is certified that error appears in the above-identified patent and that said Letters Patent is hereby corrected as shown below:

In the Claims

<u>Column 20, Line 58, Claim 14:</u>
"on the an active side of the die," should read: -- on the active side of the die, --

Signed and Sealed this
Fourth Day of April, 2023

Katherine Kelly Vidal
*Director of the United States Patent and Trademark Office*